(12) United States Patent
Kuo et al.

(10) Patent No.: US 7,917,565 B2
(45) Date of Patent: Mar. 29, 2011

(54) HIGH-SPEED RADIX-4 BUTTERFLY MODULE AND METHOD OF PERFORMING VITERBI DECODING USING THE SAME

(75) Inventors: Tsung-Sheng Kuo, Taipei (TW); Chau-Yun Hsu, Taipei (TW); Yuan-Hung Hsu, Taipei (TW)

(73) Assignee: Tatung Company, Taipei (TW)

( * ) Notice: Subject to any disclaimer, the term of this patent is extended or adjusted under 35 U.S.C. 154(b) by 994 days.

(21) Appl. No.: 11/797,790

(22) Filed: May 8, 2007

(65) Prior Publication Data
US 2008/0162617 A1      Jul. 3, 2008

(30) Foreign Application Priority Data

Dec. 29, 2006    (TW) ............................... 95149942 A

(51) Int. Cl.
*G06F 17/14*    (2006.01)
(52) U.S. Cl. ....................................................... 708/409
(58) Field of Classification Search .................. None
See application file for complete search history.

(56) References Cited

U.S. PATENT DOCUMENTS

| | | | |
|---|---|---|---|
| 2003/0140305 A1* | 7/2003 | Gatherer et al. | 714/794 |
| 2004/0133843 A1* | 7/2004 | Yamakawa | 714/794 |
| 2006/0048037 A1* | 3/2006 | Solomon et al. | 714/792 |
| 2007/0076825 A1* | 4/2007 | Graef | 375/341 |
| 2010/0002793 A1* | 1/2010 | Dent et al. | 375/265 |
| 2010/0005372 A1* | 1/2010 | Dent et al. | 714/795 |

* cited by examiner

*Primary Examiner* — David H Malzahn
(74) *Attorney, Agent, or Firm* — Bacon & Thomas, PLLC

(57) ABSTRACT

A high-speed radix-4 butterfly module and the method of performing Viterbi decoding using the same. The high-speed radix-4 butterfly module includes first to fourth add-compare-select (ACS) circuits. The first and the second ACS circuits receive first to fourth branch metric values and first to fourth previous-stage path metric values, and accordingly produces a first and a second path metric values. The third and the fourth ACS circuits receive fifth to eighth branch metric values and the first to the fourth previous-stage path metric values, and accordingly produces a third and a fourth path metric values. The radix-4 butterfly unit of the invention uses the symmetric relation to reduce an amount of branch computation required for each radix-4 butterfly unit to a half. Thus, the circuit complexity of the typical radix-4 butterfly module and the hardware cost of the Viterbi decoder are reduced.

14 Claims, 10 Drawing Sheets

Radix-4 ACS of state x00

|  | Typical radix-4 module | Inventive radix-4 module |
|---|---|---|
| Number of slice flip flops | 113 | 112 |
| Number of 4 input LUTs | 1038 | 776 |
| Number of Slices | 573 | 438 |
| Max. Frequency (MHz) | 41.0 | 41.7 |

FIG. 15

HIGH-SPEED RADIX-4 BUTTERFLY MODULE AND METHOD OF PERFORMING VITERBI DECODING USING THE SAME

BACKGROUND OF THE INVENTION

1. Field of the Invention

The present invention relates to the technical field of signal processing and, more particularly, to a high-speed radix-4 butterfly module and the method of performing Viterbi decoding using the same.

2. Description of Related Art

Convolutional codes in current digital communication systems are widely used to increase the data transmission reliability due to the high error correction capability. A convolutional code other than a block code can increase the error correction capability by increasing the constraint length without wasting the transmission bandwidth.

A Viterbi decoder implemented by a Viterbi algorithm is a convolutional code decoder widely used in current wireless communication systems. The Viterbi decoder searches a trellis diagram for finding a path the closest to the desirably received sequence as a decoding output. FIG. 1 is a block diagram of a typical Viterbi decoder. As shown in FIG. 1, the Viterbi decoder is essentially implemented by three parts: a branch metric unit 10, an add-compare-select (ACS) unit 20 and a traceback unit 30. The branch metric unit 10 computes the branch metric values of each stage, which is the dominant operation in the entire decoder. The add-compare-select circuit 20 computes the path metric values for every path and finds a surviving path. When the length of the surviving path reaches to a traceback depth L, the traceback unit 30 starts a traceback procedure in order to obtain a decoding output through the surviving path selected.

On a Viterbi decoder implementation, the trellis diagram of each stage can be typically divided into multiple radix-2 butterfly units for simplifying the implementation and easily using the symmetric relation between the branches to simplify the branch metric computation. Further, such a way can effectively save the hardware implementation and easily use the parallel processing to speed each stage processing.

FIG. 2 is a schematic diagram of a typical radix-2 butterfly unit. As shown in FIG. 2, a radix-2 butterfly unit includes four states, and each state transition can be expressed by an origin state yx and a destination state xz, where y indicates the bits to be eliminated in the register, z indicates the current input bits, and x indicates the same bits in all states of the radix-2 butterfly unit. In this case, the output word corresponding to the state transition is byxz. Accordingly, the branch symmetry in the radix-2 butterfly unit can be expressed as follows:

$$b_{0x0} = \overline{b_{0x1}} = \overline{b_{1x0}} = b_{1x1}. \qquad (1)$$

Namely, upon the symmetry shown in equation (1), the computation for the four branch metric values can be reduced to one.

In accordance with the features, the Viterbi decoder can have a decoding output only after the L-stage or higher butterfly unit is computed. Namely, the decoding output is obtained after an L-stage operation delay. In order to reduce the operation delay required for obtaining the decoding output, the radix-4 butterfly structure is provided to increase the processing speed.

In a radix-4 butterfly structure, each radix-4 butterfly unit is obtained by combining two stages of radix-2 butterfly unit into one. In this case, the delay time can be reduced from two stages of radix-2 butterfly unit to one stage of radix-4 butterfly unit, so as to speed the entire decoding output. FIG. 3 is a schematic diagram of a typical radix-4 butterfly unit. As shown in FIG. 3, the delay time can be reduced from two stages of radix-2 butterfly unit to one stage of radix-4 butterfly unit since the two stages are combined into the one stage. Accordingly, the L-stage operation delay is reduced to an L/2, and the entire decoding output is speeded.

Using the radix-4 butterfly structure in implementation can speed the decoding output of the decoder, but the circuit corresponding to a radix-4 butterfly unit becomes complex and takes more hardware cost. FIG. 4 is a schematic diagram of an add-compare-select (ACS) unit of a typical radix-4 butterfly unit. As shown in FIG. 4, in addition to more branch metric values to be computed, the radix-4 butterfly unit has the increased input number of four on each comparator, which means a higher cost to implement the Viterbi decoder by the radix-4 butterfly structure. Also, the symmetric relation in equation (1) is not available.

In implementation of the Viterbi decoders, the symmetric relation between branches in the trellis diagram is used in the prior art to relatively reduce the computational amount of branch metric values required by the decoder, but such a branch relation is only suitable for a radix-2 trellis diagram, not for a radix-4 trellis diagram obtained by combining two stages of radix-2 butterfly unit.

Therefore, it is desirable to provide an improved radix-4 butterfly structure to mitigate and/or obviate the aforementioned problems.

SUMMARY OF THE INVENTION

An object of the present invention is to provide a high-speed radix-4 butterfly module and the method of performing Viterbi decoding using the same, which can reduce the circuit complexity of the radix-4 butterfly module and the hardware cost of the Viterbi decoder in the prior art.

Another object of the present invention is to provide a high-speed radix-4 butterfly module and the method of performing Viterbi decoding using the same, which can increase the timing of the typical Viterbi decoder and the system performance.

In accordance with one aspect of the present invention, there is provided a high-speed radix-4 butterfly module. The module includes first to fourth add-compare-select (ACS) circuits. The first ACS circuit receives first to fourth branch metric values and first to fourth previous-stage path metric values, and accordingly produces a first path metric value. The second ACS circuit receives the first to the fourth branch metric values and the first to the fourth previous-stage path metric values, and accordingly produces a second path metric value. The third ACS circuit receives fifth to eighth branch metric values and the first to the fourth previous-stage path metric values, and accordingly produces a third path metric value. The fourth ACS circuit receives the fifth to the eighth branch metric values and the first to the fourth previous-stage path metric values, and accordingly produces a fourth path metric value.

In accordance with another aspect of the present invention, there is provided a method of performing Viterbi decoding. The method includes the steps: (A) providing a radix-4 butterfly module and initializing an index I; (B) receiving an input data and initializing an index J; (C) in accordance with the input data to compute eight branch metric values at Jth-time; (D) applying the radix-4 butterfly module to produce first to fourth surviving path metric values in accordance with the eight branch metric values and first to fourth previous-stage path metric values; (E) adding the index J by one and accordingly determining if the index J is smaller than N/4, where N indicates a number of states in a trellis diagram corresponding to the radix-4 butterfly module; (F) adding the index I by one when step (E) determines that the index J is not smaller than N/4, and further determining if the index I is smaller than L, where L indicates a predetermined value; (G) performing a traceback procedure when step (F) determines that the index I is not smaller than L.

Other objects, advantages, and novel features of the invention will become more apparent from the following detailed description when taken in conjunction with the accompanying drawings.

BRIEF DESCRIPTION OF THE DRAWINGS

FIG. 15 is a schematic diagram of a used resource comparison of a typical and an inventive radix-4 butterfly module.

DETAILED DESCRIPTION OF THE PREFERRED EMBODIMENT

Figure 1:
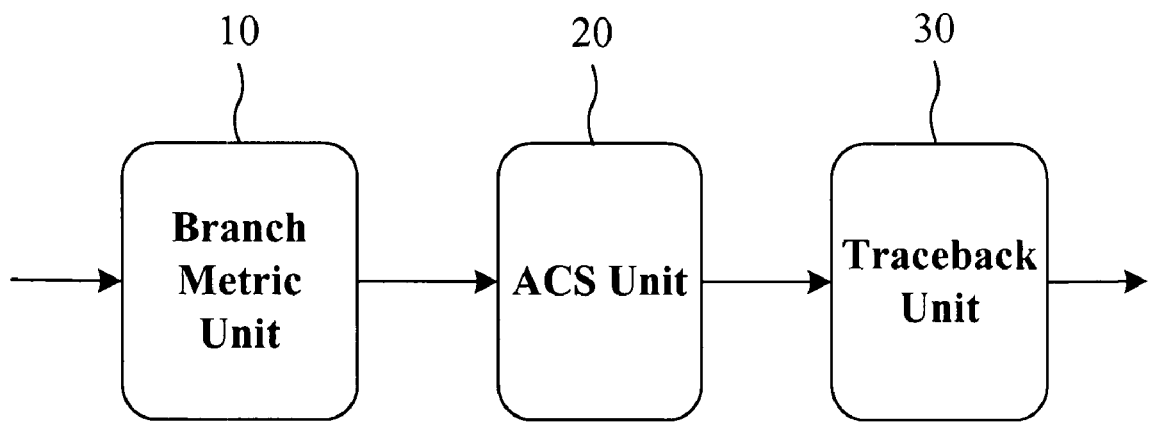
FIG. 1 is a block diagram of a typical Viterbi decoder.
Figure 2:
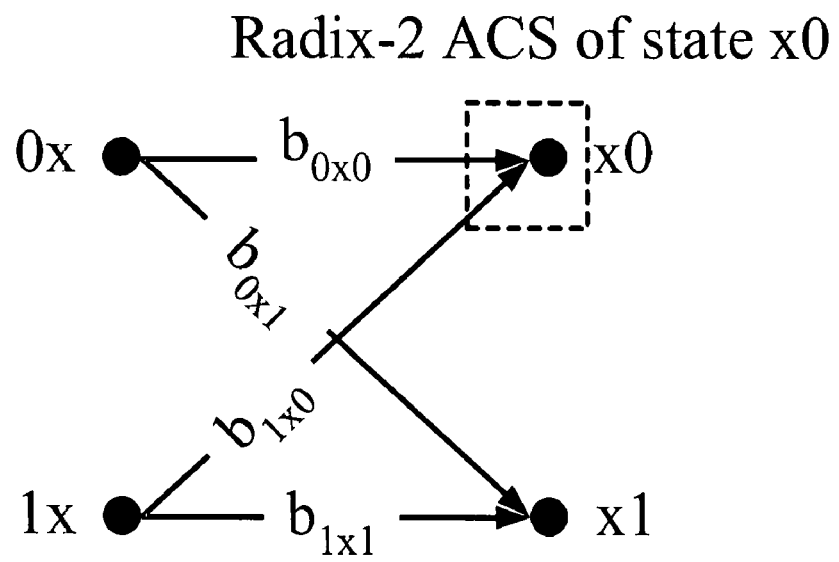
FIG. 2 is a schematic diagram of a typical radix-2 butterfly unit.
Figure 3:
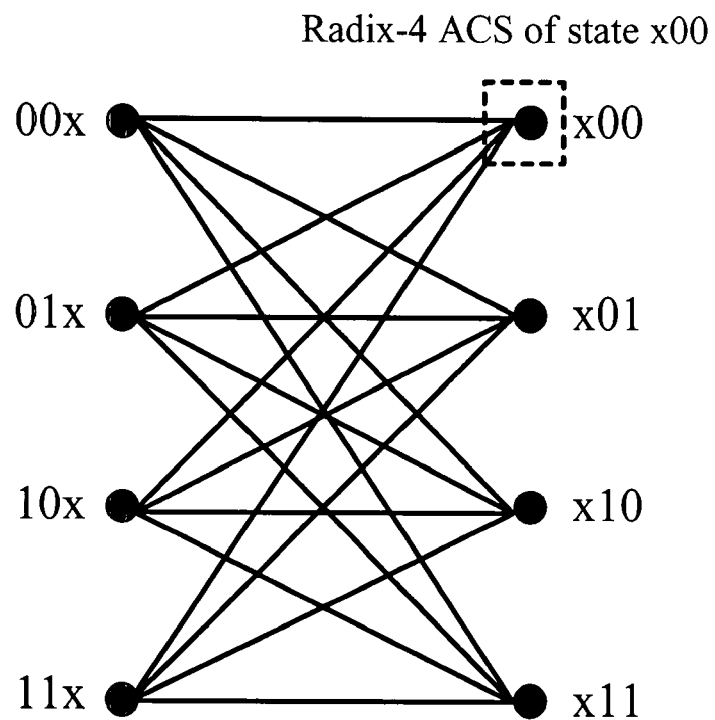
FIG. 3 is a schematic diagram of a typical radix-4 butterfly unit.
Figure 4:
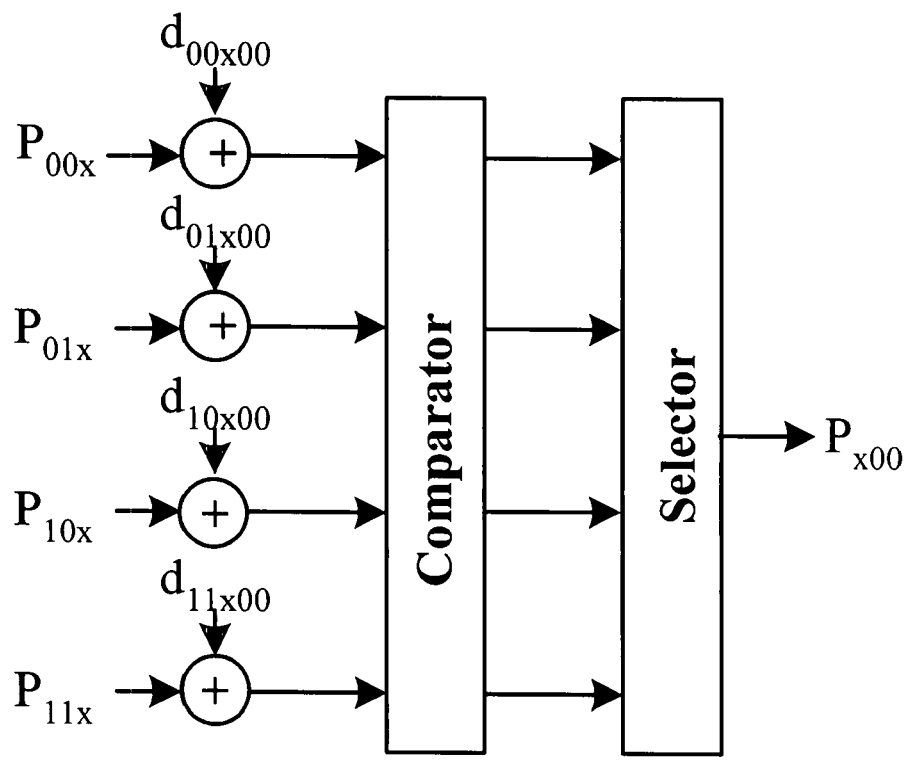
FIG. 4 is a schematic diagram of an add-compare-select (ACS) unit of a typical radix-4 butterfly unit.
Figure 5:
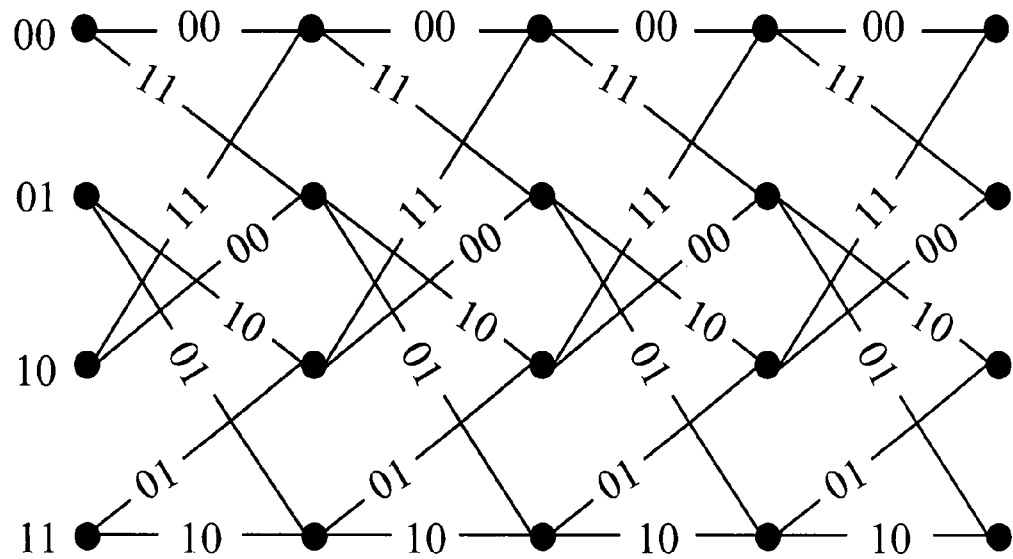
FIG. 5 is a trellis diagram with code rate 1/2 and four states.
Figure 6:
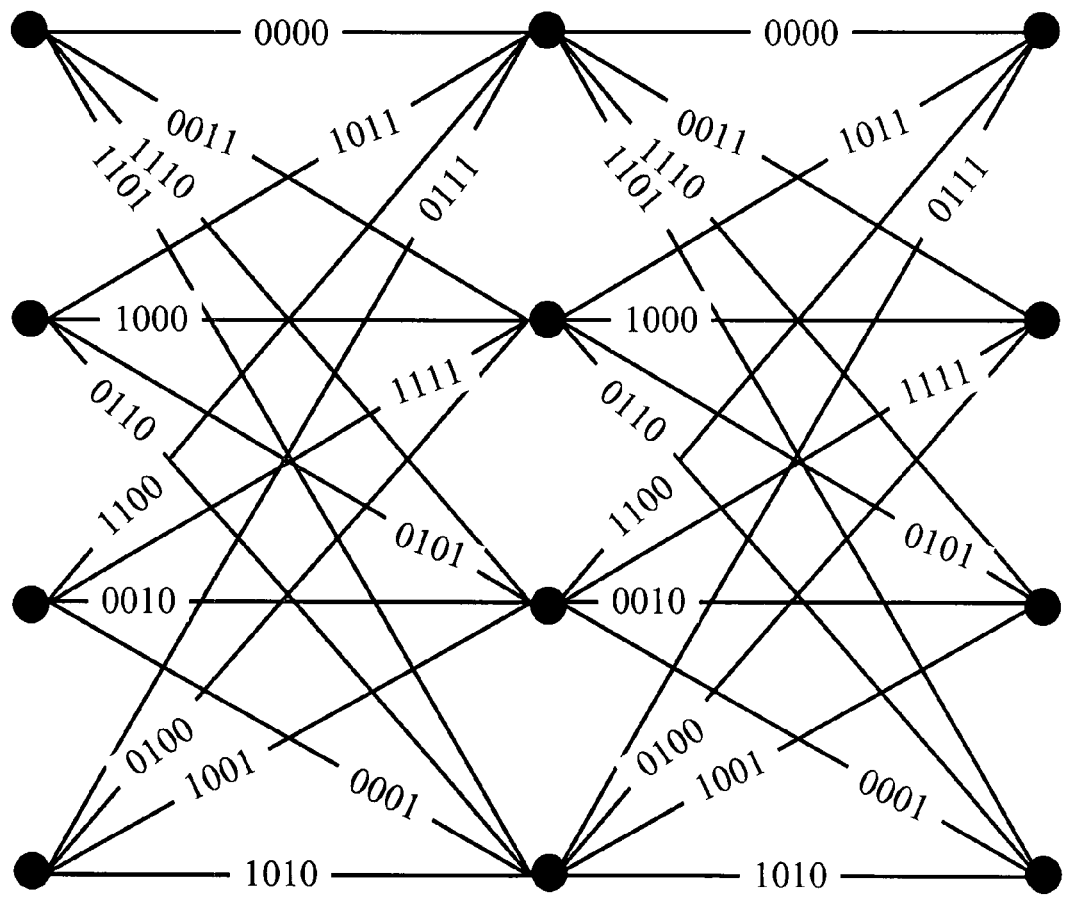
FIG. 6 is a radix-4 trellis diagram corresponding to the radix-2 trellis diagram of FIG. 5.

FIG. 5 is a trellis diagram with a code rate 1/2 and four states. As shown in FIG. 5, the trellis diagram uses the radix-2 butterfly structure to form the branch metric units. A two-stage radix-2 trellis diagram can be combined into a one-stage radix-4 trellis diagram. Namely, each branch in the radix-4 butterfly structure is associated with two input bits and has a branch word with four bits. Selecting the most-likely path in the radix-4 trellis diagram after combination is not affected because the paths of the radix-4 trellis diagram corresponds to the paths of the two radix-2 trellis diagrams in a one-to-one manner. FIG. 6 is a radix-4 trellis diagram corresponding to the radix-2 trellis diagram of FIG. 5. As shown in FIGS. 3 and 6, in a radix-4 trellis diagram, each radix-4 butterfly unit has four origin states and four destination states. Each state transition is expressed by an origin state $v1v2x$ and a destination state $xz1z2$, where $v1v2$ indicates bits to be moved out of the shift register, $z1z2$ indicates two input bits, and x indicates the same bits in all states. Each state transition has a branch word expressed by $b_{y1yxz1z2}$. For each radix-4 butterfly unit, the add-compare-select (ACS) unit operated at State x00 can refer to the design of FIG. 4 in which the branch metric $d_{y1yxz1z2}$ corresponds to the branch word $b_{y1yxz1z2}$. A path metric value $P_{x00}$ at State x00 is obtained by accumulating the branch metric values of the surviving path at State x00.

When the radix-4 butterfly structure is applied, the path metric value obtained after the ACS circuit is operated once is obtained in the radix-2 butterfly structure by operating a two-stage ACS circuit. Thus, the radix-4 butterfly structure can have an operation speed faster than the radix-2 butterfly structure by one time. However, the radix-4 butterfly structure requires a more complex comparator, and the branch metric values are also complex than those of the radix-2 butterfly structure. Accordingly, the doubled operation speed is an ideal only.

Figure 7:
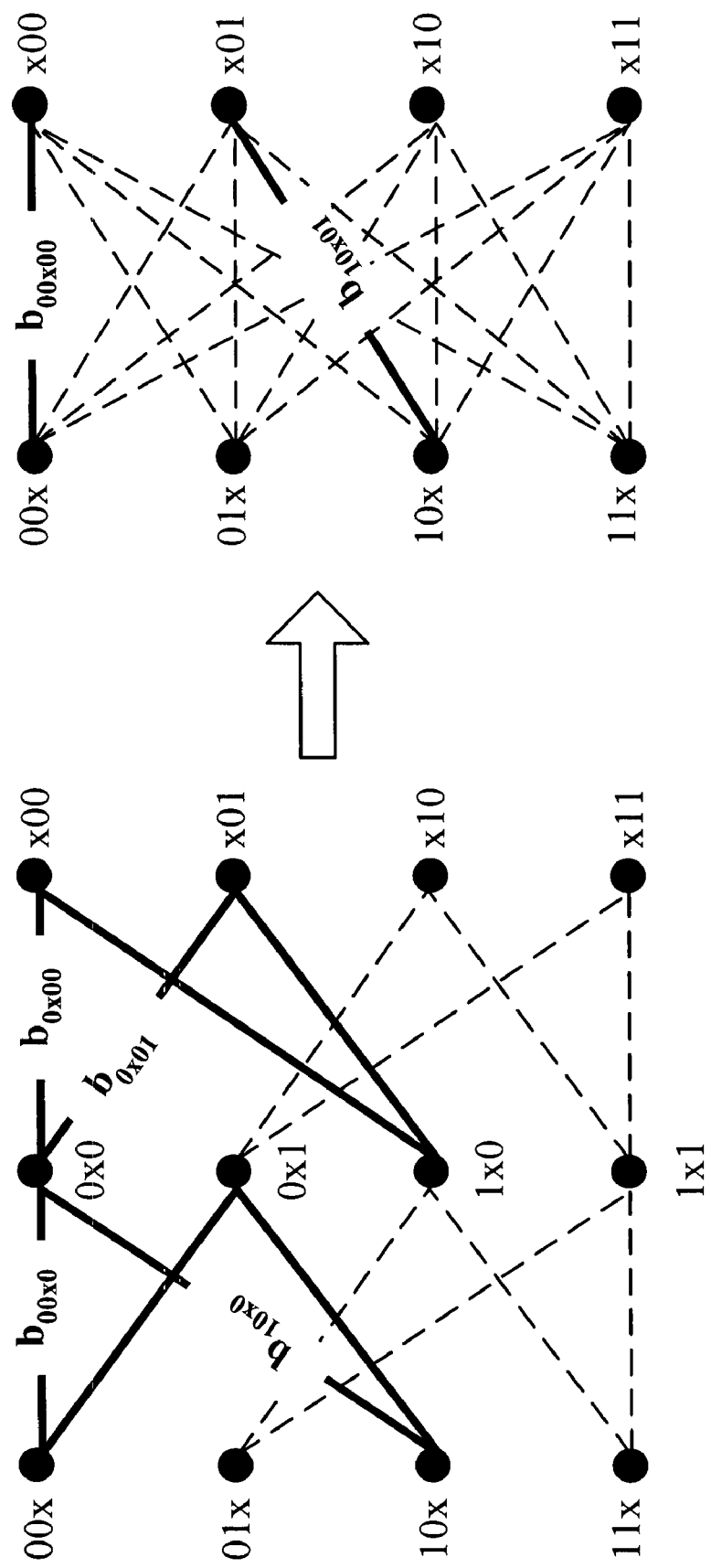
FIG. 7 is a schematic diagram of converting a radix-2 into a radix-4 butterfly structure in accordance with the invention.

The symmetry in the radix-2 butterfly structure cannot be suitable for the radix-4 butterfly structure, but the invention still finds the symmetry suitable for the radix-4 butterfly structure. FIG. 7 is a schematic diagram of converting a radix-2 into a radix-4 butterfly structure in accordance with the invention. As shown in FIG. 7, each branch in the radix-4 butterfly structure combines two branches in the radix-2 butterfly structure. For example, branch word $b_{00x00}$ in the radix-4 butterfly structure is comprised of branch word $b_{00x0}$ in the first stage and branch word $b_{0x00}$ in the second stage, i.e., $b_{00x00} = b_{00x0}b_{0x00}$. Similarly, branch word $b_{10x01}$ in the radix-4 butterfly structure is comprised of branch word $b_{10x0}$ in the first stage and branch word $b_{0x01}$ in the second stage, i.e., $b_{10x01} = b_{10x0}b_{0x01}$. In this case, $b_{00x0}$ and $b_{10x0}$ belong to the first stage of the radix-2 butterfly structure, and thus a relation $b_{00x0} = \overline{b_{10x0}}$ is obtained in accordance with equation (1). Similarly, $b_{0x00}$ and $b_{0x01}$ belong to the second stage of the radix-2 butterfly structure, and thus a relation $b_{0x00} = \overline{b_{0x01}}$ is obtained in accordance with equation (1). Accordingly, the branch words $b_{00x00}$ and $b_{10x01}$ can be expressed as follows:

$$b_{00x00} = b_{00x0}b_{0x00}$$
$$= \overline{b_{10x0}b_{0x01}}$$
$$= \overline{b_{10x1}}.$$

Therefore, the symmetry between two branch words in the radix-4 butterfly structure can be expressed by equation (3):

$$b_{00x00} = \overline{b_{10x00}}$$
$$b_{01x00} = \overline{b_{11x01}}$$
$$b_{00x01} = \overline{b_{10x00}}$$
$$b_{01x01} = \overline{b_{11x00}}$$
$$b_{00x10} = \overline{b_{10x11}}$$
$$b_{01x10} = \overline{b_{11x11}}$$
$$b_{00x11} = \overline{b_{10x10}}$$
$$b_{01x11} = \overline{b_{11x10}}. \qquad (3)$$

Figure 8:
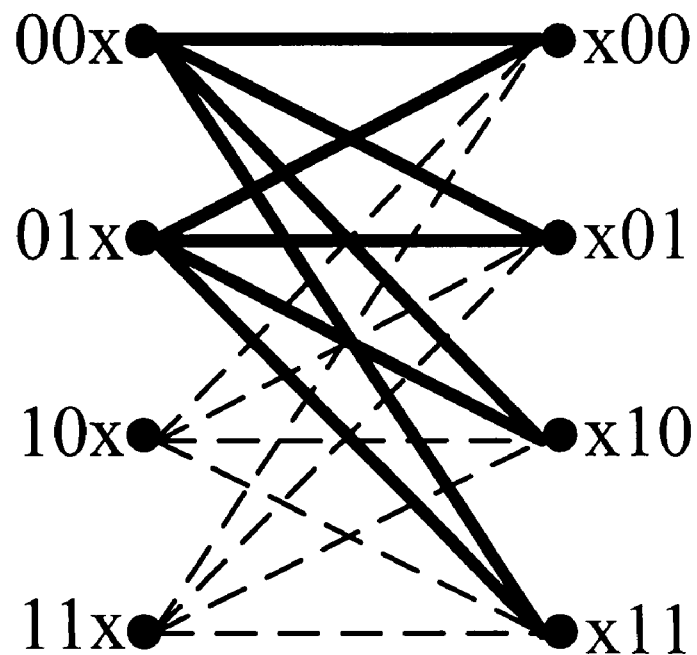
FIG. 8 is a schematic diagram of branch symmetries of a radix-4 butterfly unit in accordance with the invention.

In accordance with the symmetries shown in equation (3), only eight branch metric values in the radix-4 butterfly unit have to be computed. FIG. 8 is a schematic diagram of the branch symmetries of the radix-4 butterfly unit in accordance with the invention. As shown in FIG. 8, the eight branch metric values, which are indicated by the solid lines and referred to as kernel metric values, are actually computed, and the other eight ones indicated by the broken lines can be derived from the eight branch metric values indicated by the solid lines, without a computation.

Upon a hard-decision decoding, the branch metric computation of the radix-4 butterfly unit uses a Hamming distance. In this case, in accordance with equation (3), the branch metric values can be expressed as follows:

$$d_{00x00}=n-d_{10x01}$$

$$d_{01x00}=n-d_{11x01}$$

$$d_{00x01}=n-d_{10x00}$$

$$d_{01x01}=n-d_{11x00}$$

$$d_{00x10}=n-d_{10x11}$$

$$d_{01x10}=n-d_{11x11}$$

$$d_{00x11}=n-d_{10x10}$$

$$d_{01x11}=n-d_{11x10}, \quad (4)$$

where a branch metric value $d_{y1y2xz1z2}$ corresponds to a branch word $b_{y1y2xz1z2}$ and n indicates a number of output bits. In accordance with equation (4), it is known that in the hard-decision decoding, only eight kernel metric values in a same radix-4 butterfly unit are actually computed, the other eight ones can be obtained by a simple subtraction.

Upon a soft-decision decoding, the branch metric computation of the radix-4 butterfly unit uses a Euclidean distance. For a Gaussian channel, a 3-bit soft-decision decoding can have 3 dB coding gain more than the hard-decision decoding.

In this case, each "0" in the branch words is changed into "−1" before the branch metric values are computed in a soft-decision decoder. In the soft-decision decoder, the Euclidean distance $d_E$ between a received symbol $r=r_1 \ldots r_n$ and a branch word $y=y_1 \ldots y_n$ can be expressed by equation (5):

$$d_E = \sum_{m=1}^{n} (r_m - y_m)^2 \quad (5)$$

$$= \sum_{m=1}^{n} r_m^2 - 2y_m r_m + y_m^2.$$

For all branches, $$\sum_{m=1}^{n} r_m^2$$

and $$\sum_{m=1}^{n} y_m^2$$

are the same and accordingly can be subtracted from equation (5) without affecting the relative measure of the branch metric values. Thus, a branch metric value in the soft-decision decoder can be obtained by an inner product of the received symbol $r=r_1 \ldots r_n$ and the branch word $y=y_1 \ldots y_n$. Accordingly, the branch metric value d in the soft-decision decoder can be rewritten as follows:

$$d = \sum_{m=1}^{n} y_m r_m. \quad (6)$$

When the branch metric value d is the maximum, the Euclidean distance $d_E$ is the minimum. Thus, the path metric value of the soft-decision decoder at State x00 can be updated by equation (7) as follows:

$$P_{x00}=\max(P_{00x}+d_{00x00}, P_{01x}+d_{01x00}, P_{10x}+d_{10x00}, P_{11x}+d_{11x00}). \quad (7)$$

From equation (7), it is known that a path with the maximum path metric value is selected as the surviving path at State x00 when the inner product operation in equation (6) is used to measure the metric values.

Since in the soft-decision decoder each "0" of the branch word is changed into "−1", a branch word y with a branch metric value d has a complementary branch word $\bar{y}$ with a branch metric value −d. Accordingly, the branch metric values in equation (3) can be replaced by equation (8) as follows:

$$d_{00x00}=-d_{10x01}$$

$$d_{01x00}=-d_{11x01}$$

$$d_{00x01}=-d_{10x00}$$

$$d_{01x01}=-d_{11x00}$$

$$d_{00x10}=-d_{10x11}$$

$$d_{01x10}=-d_{11x11}$$

$$d_{00x11}=-d_{10x10}$$

$$d_{01x11}=-d_{11x10}. \quad (8)$$

From the symmetries shown in equation (8), $d_{10x00}$ and $d_{11x00}$ can be obtained from $d_{00x01}$ and $d_{01x01}$, without a computation. Equation (7) can be rewritten as:

$$P_{x00}=\max(P_{00x}+d_{00x00}, P_{01x}+d_{01x00}, P_{10x}-d_{00x01}, P_{11x}-d_{01x01}). \quad (9)$$

Figure 9:
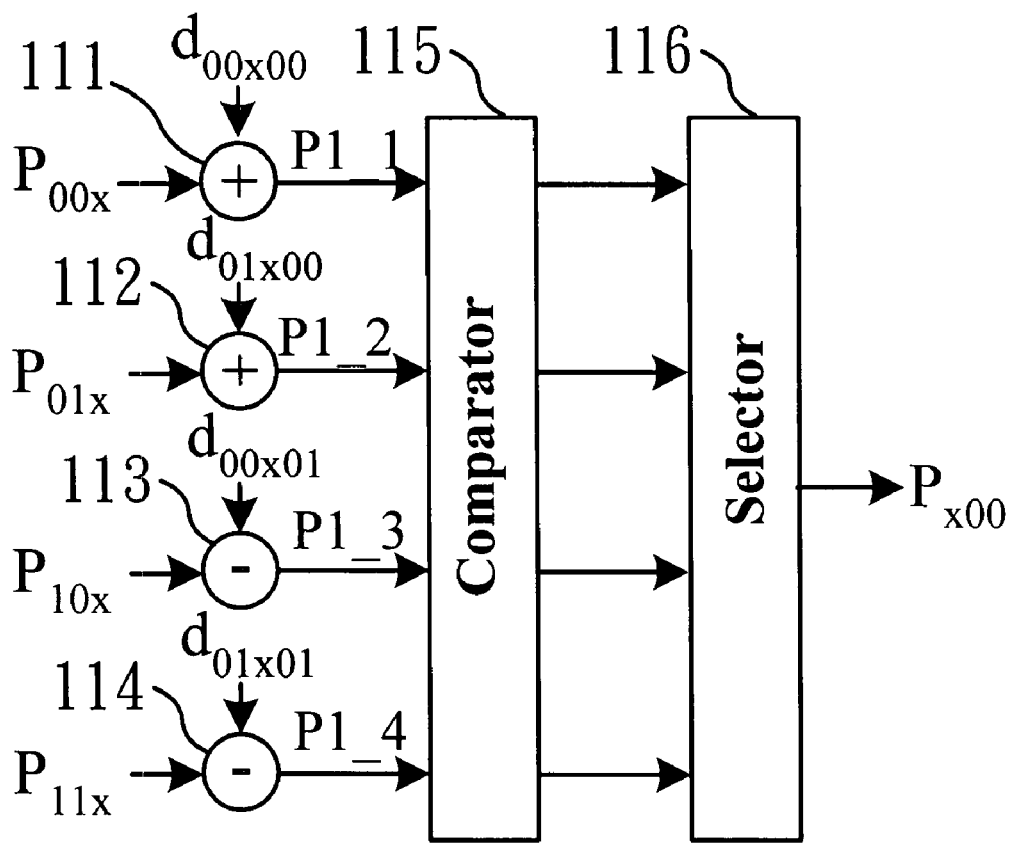
FIG. 9 a block diagram of an add-compare-select (ACS) circuit of a radix-4 butterfly unit in accordance with the invention.

FIG. 9 a block diagram of an add-compare-select (ACS) unit of the radix-4 butterfly module in accordance with the invention. The ACS circuit has two adders, two subtractors, a comparator and a selector, which computes the path metric values at State x00 as an example. Similarly, the path metric value of the soft-decision decoder at State x01 can be updated by equation (10) as follows:

$$P_{x01} = \max\begin{pmatrix} P_{00x} + d_{00x01}, P_{01x} + d_{01x01}, \\ P_{10x} + d_{10x01}, P_{11x} + d_{11x01} \end{pmatrix} \quad (10)$$

$$= \max\begin{pmatrix} P_{00x} + d_{00x01}, P_{01x} + d_{01x01}, \\ P_{10x} + d_{00x00}, P_{11x} + d_{01x00} \end{pmatrix}.$$

From equations (9) and (10), it is known that the ACS circuit at State x00 and State x01 has the same branch metric values, i.e., $\{d_{00x00}, d_{01x00}, d_{00x01}, d_{01x01}\}$. Similarly, the ACS circuit at State x10 and State x11 has the same branch metric values $\{d_{00x10}, d_{01x10}, d_{00x11}, d_{01x11}\}$. Therefore, only eight branch metric values $\{d_{00x00}, d_{01x00}, d_{00x01}, d_{01x01}, d_{00x10}, d_{01x10}, d_{00x11}, d_{01x11}\}$ in the inventive radix-4 butterfly module are necessarily computed, as cited above. The eight branch metric values computed are referred to as the kernel branch metric values.

Figure 10:
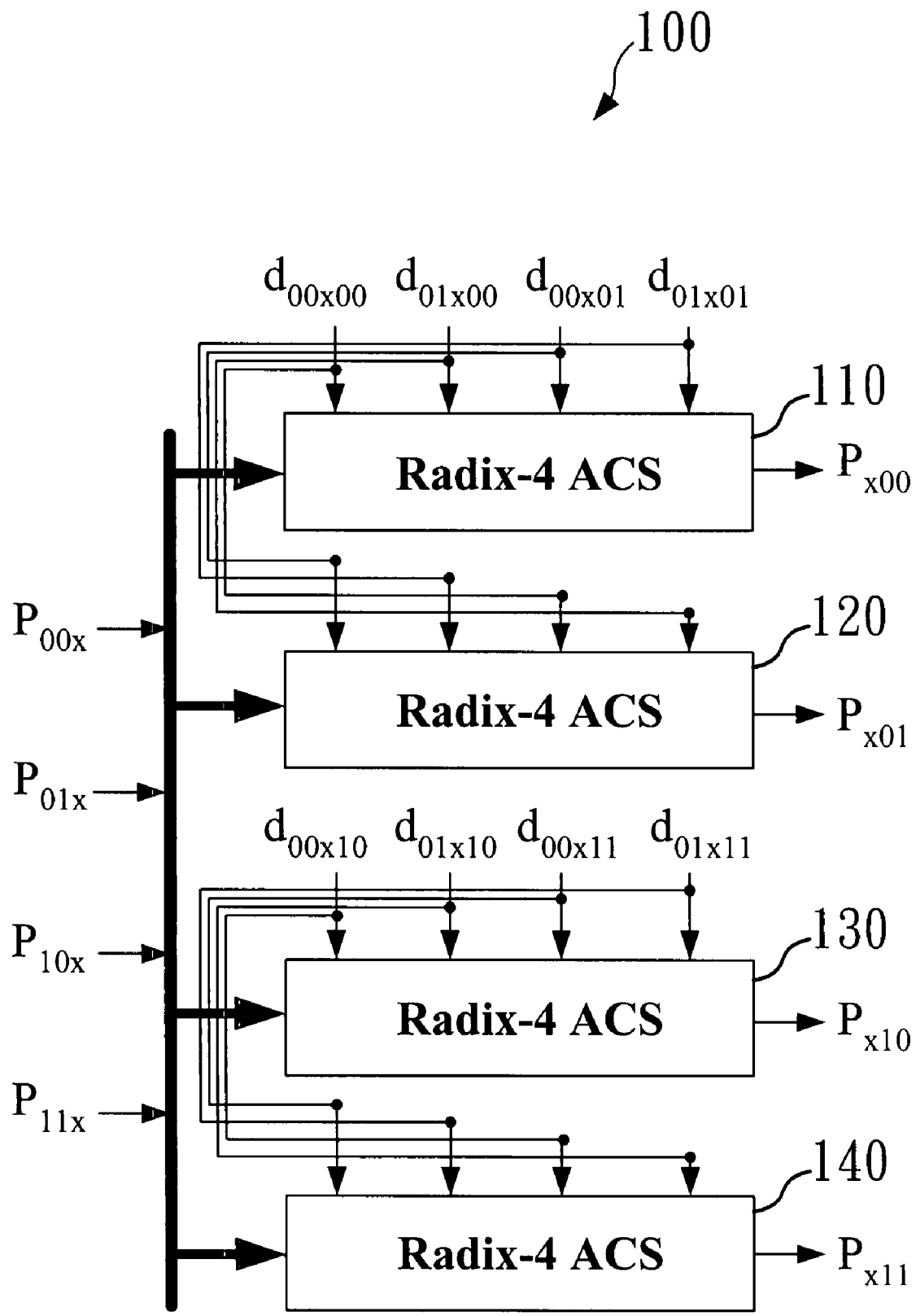
FIG. 10 is a block diagram of a high-speed radix-4 butterfly module in accordance with the invention.

FIG. 10 is a block diagram of the high-speed radix-4 butterfly module 100 in accordance with the invention, which is based on the ACS circuit of FIG. 9 to form the module 100. In FIG. 10, the module 100 includes first to fourth ACS circuits 110, 120, 130 and 140.

The first ACS circuit 110 receives first to fourth branch metric values $\{d_{00x00}, d_{01x00}, d_{00x01}, d_{01x01}\}$ and first to fourth previous-stage path metric values $\{P_{00x}, P_{01x}, P_{10x}, P_{11x}\}$, and accordingly produces a first path metric value $P_{x00}$.

The first ACS circuit 120 receives the first to the fourth branch metric values $\{d_{00x00}, d_{01x00}, d_{00x01}, d_{01x01}\}$ and the first to the fourth previous-stage path metric values $\{P_{00x}, P_{01x}, P_{10x}, P_{11x}\}$, and accordingly produces a second path metric value $P_{x01}$.

The third ACS circuit 130 receives fifth to eighth branch metric values $\{d_{00x10}, d_{01x10}, d_{00x11}, d_{01x11}\}$ and the first to the fourth previous-stage path metric values $\{P_{00x}, P_{01x}, P_{10x}, P_{11x}\}$, and accordingly produces a third path metric value $P_{x10}$.

The fourth ACS circuit 140 receives the fifth to the eighth branch metric values $\{d_{00x10}, d_{01x10}, d_{00x11}, d_{01x11}\}$ and the first to the fourth previous-stage path metric values $\{P_{00x}, P_{01x}, P_{10x}, P_{11x}\}$ and accordingly produces a fourth path metric value $P_{x11}$.

In this embodiment, the first to the fourth ACS circuits 110, 120, 130 and 140 have the same circuit configuration, and produce the first to the fourth path metric values $\{P_{x00}, P_{x01}, P_{x10}$ and $P_{x11}\}$ in accordance with the differences of the input location signals respectively.

The first ACS circuit 110 has the circuit configuration and input signals identical to that shown in FIG. 9. The first ACS circuit 110 includes a first adder 111, a second adder 112, a third subtractor 113, a fourth subtractor 114, a comparator 115 and a selector 116.

The first adder 111 has a first input terminal to receive the first branch metric value $d_{00x00}$ and a second input terminal to receive the first previous-stage path metric value $P_{00x}$, and adds the received metric values $d_{00x00}$ and $P_{00x}$ to thereby produce a first temporary path metric value P1_1.

The second adder 112 has a first input terminal to receive the second branch metric value $d_{01x00}$ and a second input terminal to receive the second previous-stage path metric value $P_{01x}$, and adds the received metric values $d_{01x00}$ and $P_{01x}$ to thereby produce a second temporary path metric value P1_2.

The third subtractor 113 has a first input terminal to receive the third branch metric value $d_{00x01}$ and a second input terminal to receive the third previous-stage path metric value $P_{10x}$, and subtracts the received metric value $d_{00x01}$ from the received metric value $P_{10x}$ to thereby produce a third temporary path metric value P1_3.

The fourth subtractor 114 has a first input terminal to receive the fourth branch metric value $d_{01x01}$ and a second input terminal to receive the fourth previous-stage path metric value $P_{11x}$, and subtracts the received metric value $d_{01x01}$ from the received metric value $P_{11x}$ to thereby produce a fourth temporary path metric value P1_4.

The comparator 115 is connected to the first adder 111, the second adder 112, the third subtractor 113 and the fourth subtractor 114 in order to select the maximum one from the first to the fourth temporary path metric values {P1_, P1_2, P1_3, P1_4} as the output of the first ACS circuit 110.

The selector 116 is connected to the comparator 115 in order to select the maximum one from the first to the fourth temporary path metric values {P1_, P1_2, P1_3, P1_4} as an output of the first ACS circuit 110 to thereby produce the first path metric value $P_{x00}$.

Figure 11:
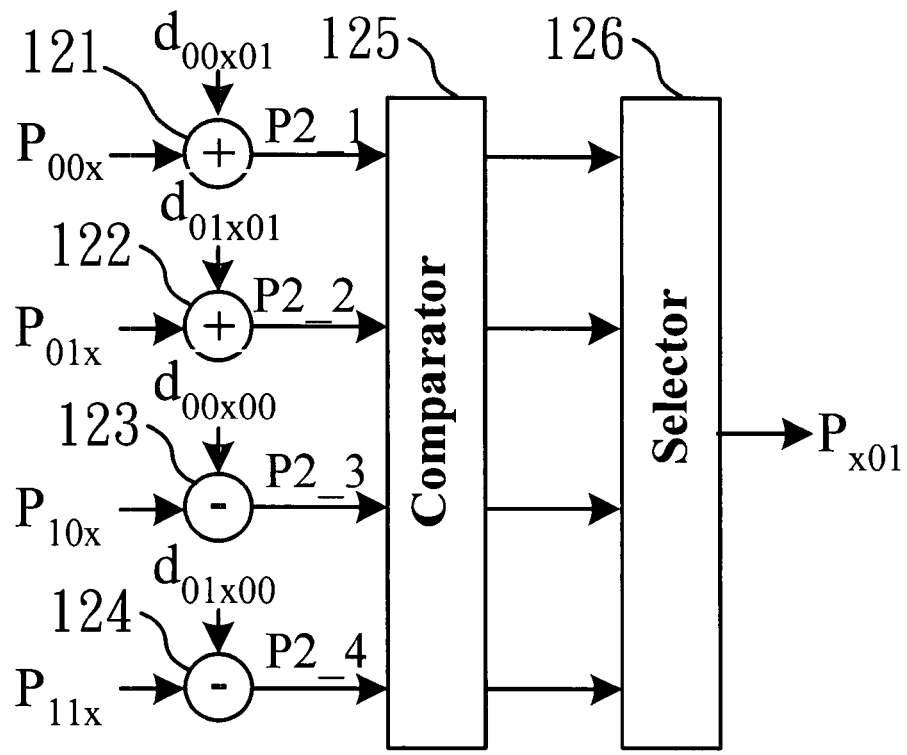
FIG. 11 a schematic diagram of the configuration and associated input signals of another add-compare-select (ACS) circuit in accordance with the invention.

FIG. 11 a schematic diagram of the configuration and associated input signals of the second add-compare-select (ACS) circuit 120 in accordance with the invention. The second ACS circuit 120 includes a first adder 121, a second adder 122, a third subtractor 123, a fourth subtractor 124, a comparator 125 and a selector 126.

The first adder 121 has a first input terminal to receive the third branch metric value $d_{00x01}$ and a second input terminal to receive the first previous-stage path metric value $P_{00x}$, and adds the received metric values $d_{00x01}$ and $P_{00x}$ to thereby produce a first temporary path metric value P2_1.

The second adder 122 has a first input terminal to receive the fourth branch metric value $d_{01x01}$ and a second input terminal to receive the second previous-stage path metric value $P_{01x}$, and adds the received metric values $d_{01x01}$ and $P_{01x}$ to thereby produce a second temporary path metric value P2_2.

The third subtractor 123 has a first input terminal to receive the first branch metric value $d_{00x00}$ and a second input terminal to receive the third previous-stage path metric value $P_{10x}$, and subtracts the received metric value $d_{00x00}$ from the received metric value $P_{10x}$ to thereby produce a third temporary path metric value P2_3.

The fourth subtractor 124 has a first input terminal to receive the second branch metric value $d_{01x00}$ and a second input terminal to receive the fourth previous-stage path metric value $P_{11x}$, and subtracts the received metric value $d_{01x00}$ from the received metric value $P_{11x}$ to thereby produce a fourth temporary path metric value P2_4.

The comparator 125 is connected to the first adder 121, the second adder 122, the third subtractor 123 and the fourth subtractor 114 in order to select the maximum one from the first to the fourth temporary path metric values {P2_1, P2_2, P2_3, P2_4} as the output of the second ACS circuit 120.

The selector 126 is connected to the comparator 125 in order to select the maximum one from the first to the fourth temporary path metric values {P2_1, P2_2, P2_3, P2_4} as an output of the second ACS circuit 120 to thereby produce the second path metric value $P_{x01}$.

Figure 12:
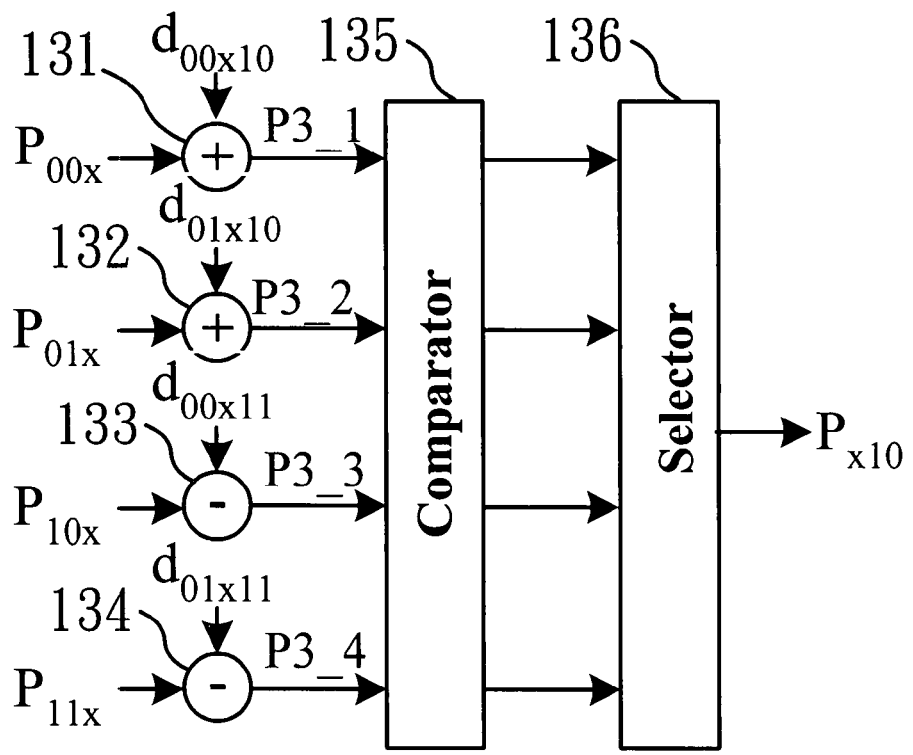
FIG. 12 a schematic diagram of the configuration and associated input signals of another add-compare-select (ACS) circuit in accordance with the invention.

FIG. 12 a schematic diagram showing the configuration and associated input signals of the third add-compare-select (ACS) circuit 130 in accordance with the invention. The third ACS circuit 130 includes a first adder 131, a second adder 132, a third subtractor 133, a fourth subtractor 134, a comparator 135 and a selector 136.

The first adder 131 has a first input terminal to receive the fifth ranch metric value $d_{00x10}$ and a second input terminal to receive the first previous-stage path metric value $P_{00x}$, and adds the received metric values $d_{00x10}$ and $P_{00x}$ to thereby produce a first temporary path metric value P3_1.

The second adder 132 has a first input terminal to receive the sixth branch metric value $d_{01x10}$ and a second input terminal to receive the second previous-stage path metric value $P_{01x}$, and adds the received metric values $d_{01x10}$ and $P_{01x}$ to thereby produce a second temporary path metric value P3_2.

The third subtractor 113 has a first input terminal to receive the seventh branch metric value $d_{00x11}$ and a second input terminal to receive the third previous-stage path metric value $P_{10x}$, and subtracts the received metric value $d_{00x11}$ from the received metric value $P_{10x}$ to thereby produce a third temporary path metric value P3_3.

The fourth subtractor 134 has a first input terminal to receive the eighth branch metric value $d_{01x11}$ and a second input terminal to receive the fourth previous-stage path metric value $P_{11x}$, and subtracts the received metric value $d_{01x11}$ from the received metric value $P_{11x}$ to thereby produce a fourth temporary path metric value P3_4.

The comparator 135 is connected to the first adder 131, the second adder 132, the third subtractor 133 and the fourth subtractor 134 in order to select the maximum one from the first to the fourth temporary path metric values {P3_1, P3_2, P3_3, P3_4} as the output of the third ACS circuit 130.

The selector 136 is connected to comparator 135 in order to select the maximum from the first to the fourth temporary path metric values {P3_1, P3_2, P3_3, P3_4} as an output of the third ACS circuit 130 to thereby produce the third path metric value $P_{x10}$.

Figure 13:
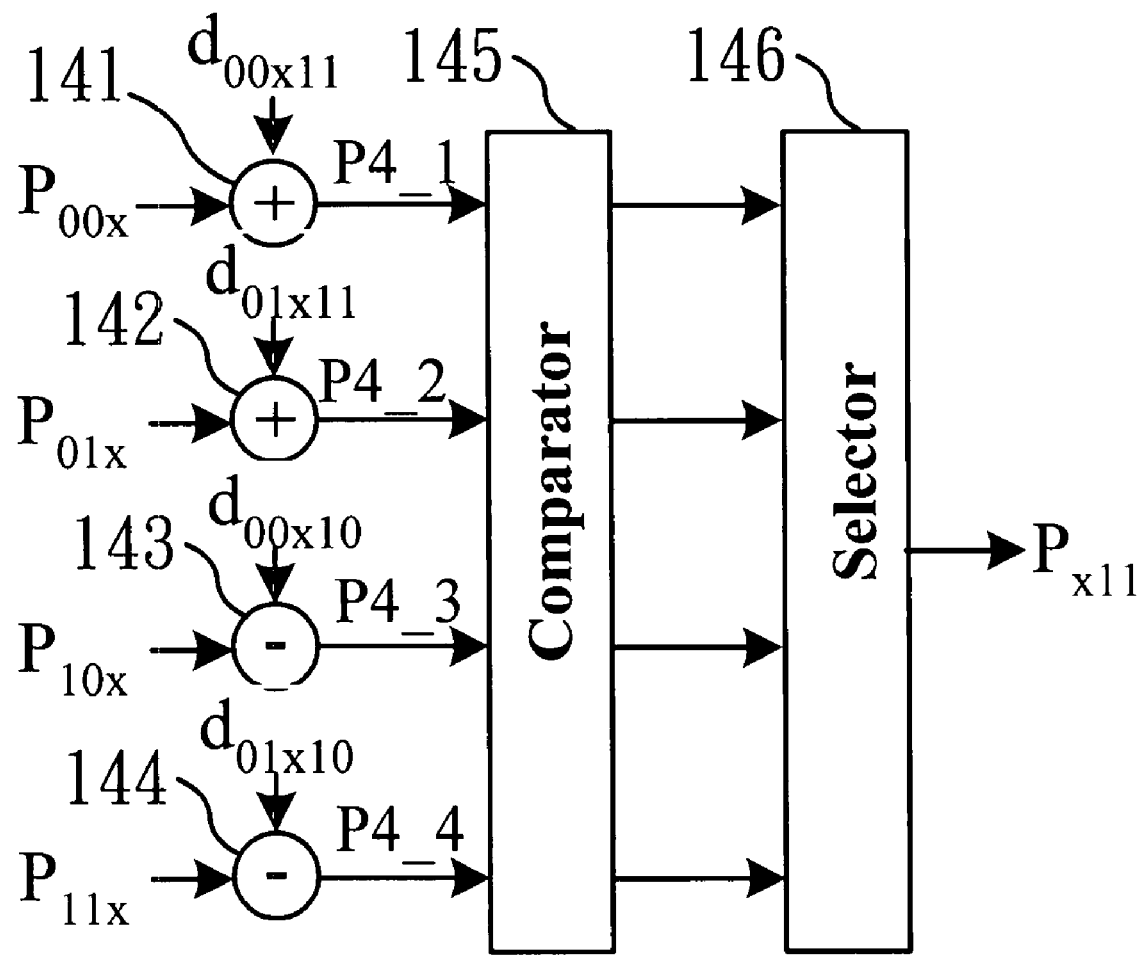
FIG. 13 a schematic diagram of the configuration and associated input signals of another add-compare-select (ACS) circuit in accordance with the invention.

FIG. 13 a schematic diagram of the configuration and associated input signals of the fourth add-compare-select (ACS) circuit 140 in accordance with the invention. The fourth ACS circuit 140 includes a first adder 141, a second adder 142, a third subtractor 143, a fourth subtractor 144, a comparator 145 and a selector 146.

The first adder 141 has a first input terminal to receive the seventh branch metric value $d_{00x11}$ and a second input terminal to receive the first previous-stage path metric value $P_{00x}$, and adds the received metric values $d_{00x11}$ and $P_{00x}$ to thereby produce a first temporary path metric value P4_1.

The second adder 142 has a first input terminal to receive the eighth branch metric value $d_{01x11}$ and a second input terminal to receive the second previous-stage path metric value $P_{01x}$, and adds the received metric values $d_{01x11}$ and $P_{01x}$ to thereby produce a second temporary path metric value P4_2.

The third subtractor 143 has a first input terminal to receive the fifth branch metric value $d_{00x10}$ and a second input terminal to receive the third previous-stage path metric value $P_{10x}$, and subtracts the received metric value $d_{00x10}$ from the received metric value $P_{10x}$ to thereby produce a third temporary path metric value P4_3.

The fourth subtractor 144 has a first input terminal to receive the sixth branch metric value $d_{01x10}$ and a second input terminal to receive the fourth previous-stage path metric value $P_{11x}$, and subtracts the received metric value $d_{01x10}$ from the received metric value $P_{11x}$ to thereby produce a fourth temporary path metric value P4_4.

The comparator 145 is connected to the first adder 141, the second adder 142, the third subtractor 143 and the fourth subtractor 144 in order to select the maximum one from the first to the fourth temporary path metric values {P4_1, P4_2, P4_3, P4_4} as the output of the fourth ACS circuit 140.

The selector 146 is connected to the comparator 145 in order to select the maximum one from the first to the fourth temporary path metric values {P4_1, P4_2, P4_3, P4_4} as an output of the fourth ACS circuit 140 to thereby produce the fourth path metric value $P_{x11}$.

In accordance with the branch symmetry relation, only eight branch metric values in the inventive radix-4 butterfly module are necessarily computed, and accordingly the hardware cost for the radix-4 butterfly module is relatively reduced.

Figure 14:
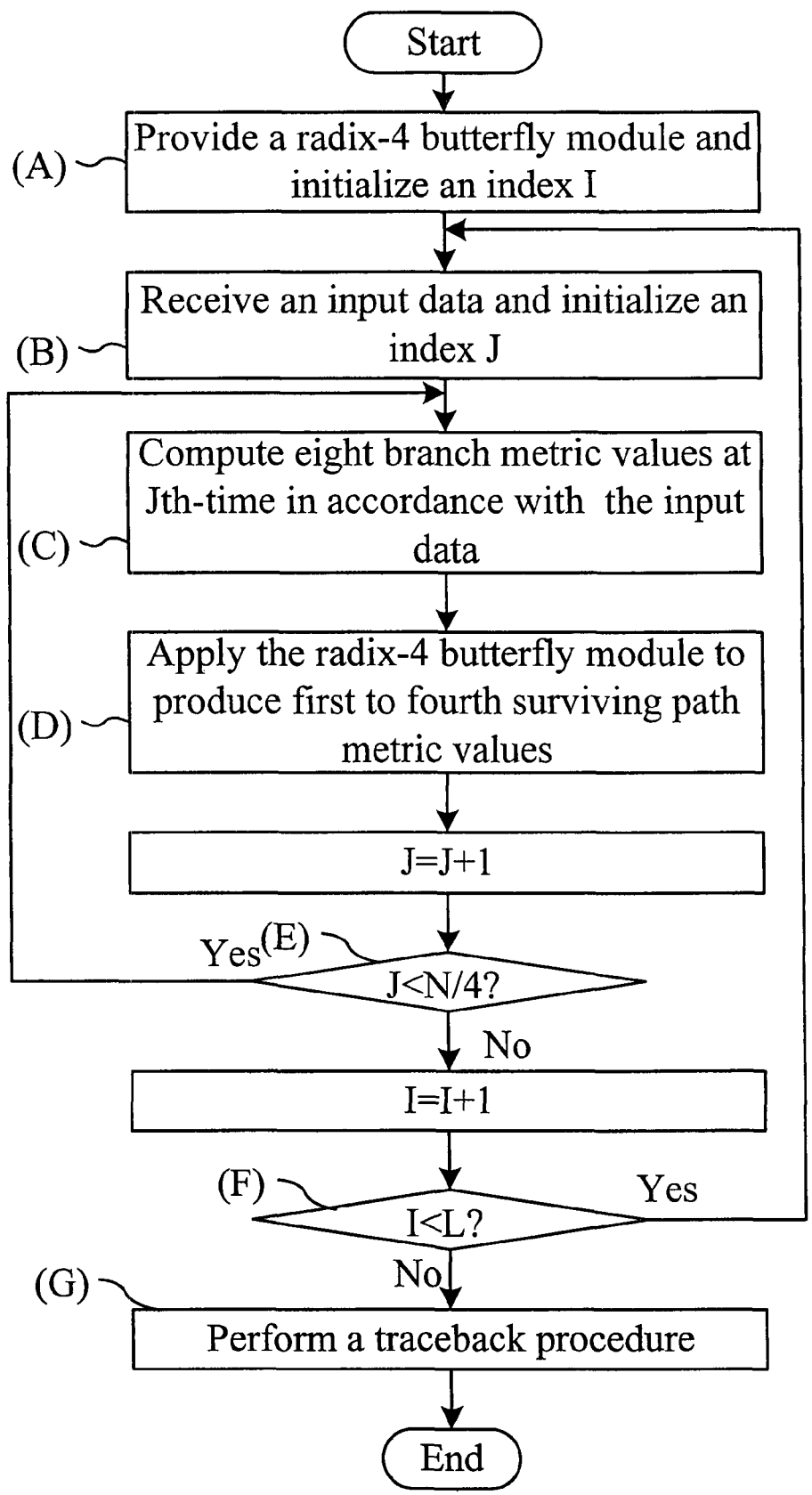
FIG. 14 is a flowchart of a method of performing Viterbi decoding in accordance with the invention.

FIG. 14 is a flowchart of a method of performing Viterbi decoding in accordance with the invention. As shown in FIG. 14, step (A) provides a radix-4 butterfly module and initializes an index I which indicates the Ith stage of a trellis diagram corresponding to the radix-4 butterfly module. When each stage of the trellis diagram is decoded, the trellis diagram with N states is divided into N/4 radix-4 butterfly units.

Step (B) receives the input data and initializes an index J. The input data is expressed by a received symbol, i.e., $r=r_1, \ldots r_n$, where J indicates Jth radix-4 butterfly unit in the Ith stage decoding on the trellis diagram.

Step (C) is based on the input data to compute eight kernel branch metric values at Jth-time. In step (C), the radix-4 butterfly module 100 is applied to produce first to fourth surviving path metric values in accordance with the eight kernel branch metric values and the first to fourth previous-stage path metric values {$P_{00x}$, $P_{01x}$, $P_{10x}$, $P_{11x}$}.

Step (E) adds the index J by one and accordingly determines if J<N/4, where N indicates a state number of the trellis diagram. If step (E) determines that J is not smaller than N/4, the index I is added by one and accordingly determines if I<L (step (F)), where L is a predetermined value. The index I is added by one for decoding a next stage of the trellis diagram since the N/4 radix-4 butterfly unit of the I-th stage decoding is complete in step (F).

If step (E) determines that J<N/4, it indicates that the N/4 radix-4 butterfly unit of the I-th stage decoding is not complete, and accordingly step (C) is executed to compute a next radix-4 butterfly unit.

If step (F) determines that I is not smaller than L, it indicates that the decoding reaches to the traceback depth L, and accordingly step (G) is executed to perform a traceback procedure. If step (F) determines that I<L, it indicates that the decoding does not reach to the traceback depth L, and accordingly step (B) is executed to decode a next stage of the trellis diagram.

FIG. 15 is a schematic diagram of a comparison of resources used by typical and inventive radix-4 butterfly module. This comparison is based on the soft-decision decoding in which uses the Xilinx xc3x200 platform and a VHDL to describe the hardware associated with the typical and the inventive radix-4 butterfly modules. As shown in FIG. 15, whether a lookup table (LUT) or slice is used, the inventive radix-4 butterfly module can reduce the required LUTs or slices more than the typical one, and especially to the 24% reduction for the slices.

As cited, the invention finds the symmetry relation among the radix-4 butterfly units to thereby reduce a number of branches to be computed necessarily to a half for each radix-4 butterfly unit, and uses the symmetry relation to design a reduced radix-4 butterfly module for implementation by a field programmable gate array (FPGA). Consequently, the inventive radix-4 butterfly module can reduce a number of slices to 24%.

In view of the foregoing, it is known that the invention provides a high-speed radix-4 butterfly module and the method of performing Viterbi decoding using the same, which can reduce the circuit complexity of the typical radix-4 butterfly module and the hardware cost of the typical Viterbi decoder, and increase the timing of typical Viterbi decoder and the system performance.

Although the present invention has been explained in relation to its preferred embodiment, it is to be understood that many other possible modifications and variations can be made without departing from the spirit and scope of the invention as hereinafter claimed.

What is claimed is:

1. A high-speed radix-4 butterfly module, comprising:
 a first add-compare-select (ACS) circuit, which receives first to fourth branch metric values and first to fourth previous-stage path metric values and accordingly produces a first path metric value;
 a second ACS circuit, which receives the first to the fourth branch metric values and the first to the fourth previous-stage path metric values and accordingly produces a second path metric value;

a third ACS circuit, which receives fifth to eighth branch metric values and the first to the fourth previous-stage path metric values and accordingly produces a third path metric value; and a fourth ACS circuit, which receives the fifth to the eighth branch metric values and the first to the fourth previous-stage path metric values and accordingly produces a fourth path metric value.

2. The radix-4 butterfly module as claimed in claim 1, wherein the first to the fourth ACS circuits have a same circuit configuration.

3. The radix-4 butterfly module as claimed in claim 2, wherein the first ACS circuit comprises:

a first adder, which has a first input terminal to receive the first branch metric value and a second input terminal to receive the first previous-stage path metric value and adds the first branch metric value and the first previous-stage path metric value to thereby produce a first temporary path metric value;

a second adder, which has a first input terminal to receive the second branch metric value and a second input terminal to receive the second previous-stage path metric value and adds the second branch metric value and the second previous path metric value to thereby produce a second temporary path metric value;

a third subtractor, which has a first input terminal to receive the third branch metric value and a second input terminal to receive the third previous-stage path metric value and subtracts the third branch metric value from the third previous-stage path metric value to thereby produce a third temporary path metric value; and a fourth subtractor, which has a first input terminal to receive the fourth branch metric value and a second input terminal to receive the fourth previous-stage path metric value and subtracts the fourth branch metric value from the fourth previous-stage path metric value to thereby produce a fourth temporary path metric value.

4. The radix-4 butterfly module as claimed in claim 3, wherein the first ACS circuit further comprises:

a comparator, which is connected to the first adder, the second adder, the third subtractor and the fourth subtractor in order to select the maximum one from the first to the fourth temporary path metric values as the output of the first ACS circuit.

5. The radix-4 butterfly module as claimed in claim 4, wherein the first ACS circuit further comprises:

a selector, which is connected to the comparator in order to select the maximum one from the first to the fourth temporary path metric values as an output of the first ACS circuit to thereby produce the first path metric value.

6. The radix-4 butterfly module as claimed in claim 2, wherein the second ACS circuit comprises:

a first adder, which has a first input terminal to receive the third branch metric value and a second input terminal to receive the first previous-stage path metric value and adds the third branch metric value and the first previous-stage path metric value to thereby produce a first temporary path metric value;

a second adder, which has a first input terminal to receive the fourth branch metric value and a second input terminal to receive the second previous-stage path metric value and adds the fourth branch metric value and the second previous path metric value to thereby produce a second temporary path metric value;

a third subtractor, which has a first input terminal to receive the first branch metric value and a second input terminal to receive the third previous-stage path metric value and subtracts the first branch metric value from the third previous-stage path metric value to thereby produce a third temporary path metric value; and a fourth subtractor, which has a first input terminal to receive the second branch metric value and a second input terminal to receive the fourth previous-stage path metric value and subtracts the second branch metric value from the fourth previous-stage path metric value to thereby produce a fourth temporary path metric value.

7. The radix-4 butterfly module as claimed in claim 6, wherein the second ACS circuit further comprises:

a comparator, which is connected to the first adder, the second adder, the third subtractor and the fourth subtractor in order to select the maximum one from the first to the fourth temporary path metric values as the output of the second ACS circuit.

8. The radix-4 butterfly module as claimed in claim 7, wherein the second ACS circuit further comprises:

a selector, which is connected to the comparator in order to select the maximum one from the first to the fourth temporary path metric values as an output of the second ACS circuit to thereby produce the second path metric value.

9. The radix-4 butterfly module as claimed in claim 2, wherein the third ACS circuit comprises:

a first adder, which has a first input terminal to receive the fifth branch metric value and a second input terminal to receive the first previous-stage path metric value and adds the fifth branch metric value and the first previous-stage path metric value to thereby produce a first temporary path metric value;

a second adder, which has a first input terminal to receive the sixth branch metric value and a second input terminal to receive the second previous-stage path metric value and adds the sixth branch metric value and the second previous path metric value to thereby produce a second temporary path metric value;

a third subtractor, which has a first input terminal to receive the seventh branch metric value and a second input terminal to receive the third previous-stage path metric value and subtracts the seventh branch metric value from the third previous-stage path metric value to thereby produce a third temporary path metric value; and a fourth subtractor, which has a first input terminal to receive the eighth branch metric value and a second input terminal to receive the fourth previous-stage path metric value and subtracts the eighth branch metric value from the fourth previous-stage path metric value to thereby produce a fourth temporary path metric value.

10. The radix-4 butterfly module as claimed in claim 9, wherein the third ACS circuit further comprises:

a comparator, which is connected to the first adder, the second adder, the third subtractor and the fourth subtractor in order to select the maximum one from the first to the fourth temporary path metric values as the output of the third ACS circuit.

11. The radix-4 butterfly module as claimed in claim 10, wherein the third ACS circuit further comprises:

a selector, which is connected to the comparator in order to select the maximum one from the first to the fourth temporary path metric values as an output of the third ACS circuit to thereby produce the third path metric value.

12. The radix-4 butterfly module as claimed in claim 2, wherein the fourth ACS circuit comprises:

a first adder, which has a first input terminal to receive the seventh branch metric value and a second input terminal to receive the first previous-stage path metric value and adds the seventh branch metric value and the first previous-stage path metric value to thereby produce a first temporary path metric value;

a second adder, which has a first input terminal to receive the eighth branch metric value and a second input terminal to receive the second previous-stage path metric value and adds the eighth branch metric value and the second previous path metric value to thereby produce a second temporary path metric value;

a third subtractor, which has a first input terminal to receive the fifth branch metric value and a second input terminal to receive the third previous-stage path metric value and subtracts the fifth branch metric value from the third previous-stage path metric value to thereby produce a third temporary path metric value; and a fourth subtractor, which has a first input terminal to receive the sixth branch metric value and a second input terminal to receive the fourth previous-stage path metric value and subtracts the sixth branch metric value from the fourth previous-stage path metric value to thereby produce a fourth temporary path metric value.

13. The radix-4 butterfly module as claimed in claim 12, wherein the fourth ACS circuit further comprises:

a comparator, which is connected to the first adder, the second adder, the third subtractor and the fourth subtractor in order to select the maximum one from the first to the fourth temporary path metric values as the output of the fourth ACS circuit.

14. The radix-4 butterfly module as claimed in claim 13, wherein the fourth ACS circuit further comprises:

a selector, which is connected to the comparator in order to select maximum one from the first to the fourth temporary path metric values as an output of the fourth ACS circuit to thereby produce the fourth path metric value.

* * * * *